United States Patent
Xie et al.

(10) Patent No.: US 9,865,754 B2
(45) Date of Patent: Jan. 9, 2018

(54) HOLE COLLECTORS FOR SILICON PHOTOVOLTAIC CELLS

(71) Applicant: Silevo, Inc., Fremont, CA (US)

(72) Inventors: Zhigang Xie, San Jose, CA (US);
Jiunn Benjamin Heng, San Jose, CA (US); Wei Wang, San Jose, CA (US);
Jianming Fu, Palo Alto, CA (US);
Zheng Xu, Pleasanton, CA (US)

(73) Assignee: TESLA, INC., Palo Alto, CA (US)

( * ) Notice: Subject to any disclaimer, the term of this patent is extended or adjusted under 35 U.S.C. 154(b) by 380 days.

(21) Appl. No.: 14/051,336

(22) Filed: Oct. 10, 2013

(65) Prior Publication Data

US 2014/0096817 A1 Apr. 10, 2014

Related U.S. Application Data

(60) Provisional application No. 61/711,838, filed on Oct. 10, 2012.

(51) Int. Cl.
*H01L 31/00* (2006.01)
*H01L 31/0352* (2006.01)
(Continued)

(52) U.S. Cl.
CPC .... *H01L 31/035209* (2013.01); *H01L 31/062* (2013.01); *H01L 31/18* (2013.01);
(Continued)

(58) Field of Classification Search
CPC ............. H01L 31/0745; H01L 31/1804; Y02P 70/521; Y02E 10/547
See application file for complete search history.

(56) References Cited

U.S. PATENT DOCUMENTS 819,360 A 3/1902 Mayer
2,626,907 A 1/1953 Melvin De Groote
(Continued)

FOREIGN PATENT DOCUMENTS

CN 1253381 5/2000
CN 1416179 10/2001
(Continued)

OTHER PUBLICATIONS

Centurioni et al., IEEE Electron Device Letters, vol. 24, No. 3, Mar. 2003, Role of Front Contact work function on amorphous silicon/crystalline silicon heterojunction solar cell performance.*
(Continued)

*Primary Examiner* — Shannon Gardner

(74) *Attorney, Agent, or Firm* — Shun Yao; Park, Vaughan, Fleming & Dowler, LLP.

(57) ABSTRACT

One embodiment of the present invention provides a solar cell. The solar cell includes a base layer comprising crystalline Si (c-Si), a hole collector situated on a first side of the base layer, and an electron collector situated on a second side of the base layer, which is opposite the first side. The hole collector includes a quantum-tunneling-barrier (QTB) layer situated adjacent to the base layer and a transparent conducting oxide (TCO) layer situated adjacent to the QTB layer. The TCO layer has a work function of at least 5.0 eV.

13 Claims, 4 Drawing Sheets

(51) Int. Cl.
*H01L 31/18* (2006.01)
*H01L 31/062* (2012.01)
(52) U.S. Cl.
CPC ........ *H01L 31/1804* (2013.01); *Y02E 10/547* (2013.01); *Y02P 70/521* (2015.11)

(56) References Cited

U.S. PATENT DOCUMENTS

| | | |
|---|---|---|
| 2,938,938 A | 5/1960 | Dickson |
| 3,094,439 A | 6/1963 | Mann |
| 3,116,171 A | 12/1963 | Nielson |
| 3,459,597 A | 8/1969 | Baron |
| 3,961,997 A | 6/1976 | Chu |
| 3,969,163 A | 7/1976 | Wakefield |
| 4,015,280 A | 3/1977 | Matsushita |
| 4,082,568 A | 4/1978 | Lindmayer |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,617,421 A | 10/1986 | Nath |
| 4,633,033 A | 12/1986 | Nath |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington |
| 4,753,683 A | 6/1988 | Ellion |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,057,163 A | 10/1991 | Barnett |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A * | 10/1996 | Ohmi ............... H01L 21/02381 118/723 E |
| 5,576,241 A | 11/1996 | Sakai |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura |
| 7,128,975 B2 | 10/2006 | Inomata |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,115,093 B2 | 2/2012 | Gui |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 2001/0008143 A1 | 7/2001 | Sasaoka |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0116185 A1 | 6/2003 | Oswald |
| 2003/0121228 A1 | 7/2003 | Stoehr |
| 2003/0168578 A1 | 9/2003 | Taguchi |
| 2003/0183270 A1 | 10/2003 | Falk |
| 2003/0201007 A1 | 10/2003 | Fraas |
| 2004/0065363 A1 | 4/2004 | Fetzer |
| 2004/0103937 A1 | 6/2004 | Bilyalov |
| 2004/0112426 A1 | 6/2004 | Hagino |
| 2004/0123897 A1 | 7/2004 | Ojima |

(56) References Cited

U.S. PATENT DOCUMENTS

| | | |
|---|---|---|
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira |
| 2005/0022861 A1 | 2/2005 | Rose |
| 2005/0061665 A1 | 3/2005 | Pavani |
| 2005/0064247 A1 | 3/2005 | Sane |
| 2005/0074954 A1 | 4/2005 | Yamanaka |
| 2005/0109388 A1 | 5/2005 | Murakami |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2006/0012000 A1 | 1/2006 | Estes |
| 2006/0060238 A1 | 3/2006 | Hacke |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0260673 A1 | 11/2006 | Takeyama |
| 2006/0272698 A1 | 12/2006 | Durvasula |
| 2006/0283496 A1 | 12/2006 | Okamoto |
| 2006/0283499 A1* | 12/2006 | Terakawa ........ H01L 31/022466 136/258 |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |
| 2007/0148336 A1 | 6/2007 | Bachrach |
| 2007/0186968 A1 | 8/2007 | Nakauchi |
| 2007/0186970 A1 | 8/2007 | Takahashi |
| 2007/0202029 A1 | 8/2007 | Burns |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0000522 A1 | 1/2008 | Johnson |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0128013 A1 | 6/2008 | Lopatin |
| 2008/0149161 A1 | 6/2008 | Nishida |
| 2008/0156370 A1 | 7/2008 | Abdallah |
| 2008/0173347 A1 | 7/2008 | Korevaar |
| 2008/0173350 A1 | 7/2008 | Choi |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0230122 A1 | 9/2008 | Terakawa |
| 2008/0251114 A1 | 10/2008 | Tanaka |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0056805 A1 | 3/2009 | Barnett |
| 2009/0078318 A1 | 3/2009 | Meyers |
| 2009/0084439 A1 | 4/2009 | Lu |
| 2009/0101872 A1 | 4/2009 | Young |
| 2009/0139512 A1 | 6/2009 | Lima |
| 2009/0151783 A1 | 6/2009 | Lu |
| 2009/0155028 A1 | 6/2009 | Boguslavskiy |
| 2009/0160259 A1 | 6/2009 | Naiknaware et al. |
| 2009/0188561 A1 | 7/2009 | Aiken |
| 2009/0221111 A1 | 9/2009 | Frolov |
| 2009/0229854 A1 | 9/2009 | Fredenberg |
| 2009/0239331 A1 | 9/2009 | Xu |
| 2009/0250108 A1 | 10/2009 | Zhou |
| 2009/0255574 A1 | 10/2009 | Yu |
| 2009/0283138 A1 | 11/2009 | Lin |
| 2009/0283145 A1 | 11/2009 | Kim |
| 2009/0293948 A1 | 12/2009 | Tucci |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu |
| 2010/0132774 A1 | 6/2010 | Borden |
| 2010/0132792 A1 | 6/2010 | Kim |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |
| 2010/0236612 A1 | 9/2010 | Khajehoddin |
| 2010/0240172 A1 | 9/2010 | Rana |
| 2010/0269904 A1 | 10/2010 | Cousins |
| 2010/0279492 A1 | 11/2010 | Yang |
| 2010/0300506 A1 | 12/2010 | Heng |
| 2010/0300507 A1 | 12/2010 | Heng |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0073175 A1 | 3/2011 | Hilali |
| 2011/0088762 A1 | 4/2011 | Singh |
| 2011/0146759 A1 | 6/2011 | Lee |
| 2011/0146781 A1 | 6/2011 | Laudisio |
| 2011/0156188 A1 | 6/2011 | Tu |
| 2011/0168250 A1 | 7/2011 | Lin |
| 2011/0168261 A1* | 7/2011 | Welser .................. G02B 1/115 136/259 |
| 2011/0174374 A1 | 7/2011 | Harder |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1* | 11/2011 | Heng .................. H01L 31/0745 136/255 |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch |
| 2011/0308573 A1 | 12/2011 | Jaus |
| 2012/0000502 A1 | 1/2012 | Wiedeman |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |

(56) References Cited

U.S. PATENT DOCUMENTS

| | | |
|---|---|---|
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Beitel |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0192932 A1 | 8/2012 | Wu |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1* | 12/2012 | Fu ................ H01L 31/0747 136/255 |
| 2012/0318319 A1 | 12/2012 | Pinarbasi |
| 2012/0318340 A1 | 12/2012 | Heng |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0124013 A1 | 5/2014 | Morad |
| 2014/0124014 A1 | 5/2014 | Morad |
| 2014/0154836 A1 | 6/2014 | Kim |
| 2014/0196768 A1 | 7/2014 | Heng |
| 2014/0242746 A1 | 8/2014 | Albadri |
| 2014/0318611 A1 | 10/2014 | Moslehi |
| 2014/0345674 A1 | 11/2014 | Yang |
| 2014/0349441 A1 | 11/2014 | Fu |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0171230 A1 | 6/2015 | Kapur |
| 2015/0214409 A1 | 7/2015 | Pfeiffer |
| 2015/0270410 A1 | 9/2015 | Heng |
| 2015/0280641 A1 | 10/2015 | Garg |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0190354 A1 | 6/2016 | Agrawal |

FOREIGN PATENT DOCUMENTS

| | | |
|---|---|---|
| CN | 101233620 | 7/2008 |
| CN | 101553933 | 10/2009 |
| CN | 100580957 C | 1/2010 |
| CN | 101305454 | 5/2010 |
| CN | 102088040 | 6/2011 |
| CN | 102263157 | 11/2011 |
| CN | 104409402 | 3/2015 |
| DE | 4030713 | 4/1992 |
| DE | 102006009194 | 8/2007 |
| DE | 202007002897 | 8/2008 |
| DE | 102008045522 | 3/2010 |
| DE | 102010061317 | 6/2012 |
| DE | 10201201051 | 11/2013 |
| DE | 102012010151 | 11/2013 |
| EP | 1770791 | 4/2007 |
| EP | 1806684 | 8/2007 |
| EP | 2071635 | 6/2009 |
| EP | 2113946 | 11/2009 |
| EP | 2362430 | 8/2011 |
| EP | 2385561 A2 | 11/2011 |
| EP | 2387079 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | 5789269 | 6/1982 |
| JP | H04245683 A | 9/1992 |
| JP | H07249788 A | 9/1995 |
| JP | 10004204 | 1/1998 |
| JP | H1131834 | 2/1999 |
| JP | 2000164902 | 6/2000 |
| JP | 2002057357 A | 2/2002 |
| JP | 2005159312 A | 6/2005 |
| JP | 2006324504 | 11/2006 |
| JP | 2008135655 | 6/2008 |
| JP | 2009054748 | 3/2009 |
| JP | 2009177225 | 8/2009 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 20050122721 A | 12/2005 |
| KR | 20060003277 A | 1/2006 |
| KR | 20090011519 A | 2/2009 |
| WO | 9117839 | 11/1991 |
| WO | 9120097 A1 | 12/1991 |
| WO | 03083953 A1 | 10/2003 |
| WO | 2006097189 A1 | 9/2006 |
| WO | 2008089657 | 7/2008 |
| WO | 2009094578 | 7/2009 |
| WO | 2009150654 | 12/2009 |
| WO | 2009150654 A2 | 12/2009 |
| WO | 2010070015 | 6/2010 |
| WO | 2010075606 | 7/2010 |
| WO | 2010075606 A1 | 7/2010 |
| WO | 2010104726 A2 | 9/2010 |
| WO | 2010123974 | 10/2010 |
| WO | 2010123974 A1 | 10/2010 |
| WO | 2011005447 | 1/2011 |
| WO | 2011005447 A2 | 1/2011 |
| WO | 2011008881 | 1/2011 |
| WO | 2011008881 A2 | 1/2011 |
| WO | 2011053006 | 5/2011 |
| WO | 2011123646 A2 | 10/2011 |
| WO | 2013020590 | 2/2013 |

(56) References Cited

FOREIGN PATENT DOCUMENTS

| WO | 2013020590 A1 | 2/2013 |
|---|---|---|
| WO | 2010085949 | 3/2013 |
| WO | 2013046351 | 4/2013 |
| WO | 2014066265 | 5/2014 |
| WO | 2014074826 | 7/2014 |
| WO | 2014110520 | 7/2014 |
| WO | 2014117138 | 7/2014 |
| WO | 2015183827 | 12/2015 |
| WO | 2016090332 | 6/2016 |

OTHER PUBLICATIONS

Beaucarne G et al: 'Epitaxial thin-film Si solar cells' Thin Solid Films, Elsevier-Sequoia S.A. Lausanne, CH LNKD—DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].

Chabal, Yves J. et al., 'Silicon Surface and Interface Issues for Nanoelectronics,' the Electrochemical Society Interface, Spring 2005, pp. 31-33.

Collins English Dictionary (Convex. (2000). In Collins English Dictionary. http://search.credoreference.com/content/entry/hcengdict/convex/0 on Oct. 18, 2014).

Davies, P.C.W., 'Quantum tunneling time,' Am. J. Phys. 73, Jan. 2005, pp. 23-27.

Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.

Green, Martin A. et al., 'High-Efficiency Silicon Solar Cells,' IEEE Transactions on Electron Devices, vol. ED-31, No. 5, May 1984, pp. 679-683.

Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.

JCS Pires, J Otubo, AFB Braga, PR Mei; The purification of metallurgical grade silicon by electron beam melting, J of Mats Process Tech 169 (2005) 16-20.

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.

Merriam-Webster online dictionary—"mesh". (accessed Oct. 8, 2012).

Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.

Mueller, Thomas, et al. "High quality passivation for heteroj unction solar cells by hydrogenated amorphous silicon suboxide films." Applied Physics Letters 92.3 (2008): 033504-033504.

Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).

O'Mara, W.C.; Herring, R.B.; Hunt L.P. (1990). Handbook of Semiconductor Silicon Technology. William Andrew Publishing/Noyes. pp. 275-293.

Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.

Stangl et al., Amorphous/Crystalline Silicon heterojunction solar cells—a simulation study; 17th European Photovoltaic Conference, Munich, Oct. 2001.

Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.

WP Leroy et al., "In Search for the Limits of Rotating Cylindrical Magnetron Sputtering", Magnetron, Ion Processing and ARC Technologies European Conference, Jun. 18, 2010, pp. 1-32.

Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.

Hornbachner et al., "Cambered Photovoltaic Module and Method for its Manufacture" Jun. 17, 2009.

Machine translation of JP 10004204 A, Shindou et al.

Parthavi, "Doping by Diffusion and Implantation", <http://www.leb.eei.uni-erlangen.de/winterakademie/2010/report/course03/pdf/0306.pdf>.

Weiss, "Development of different copper seed layers with respect to the copper electroplating process," Microelectronic Engineering 50 (2000) 443-440, Mar. 15, 2000.

Tomasi, "Back-contacted Silicon Heterojunction Solar Cells With Efficiency>21%" 2014 IEEE.

"Nonequilibrium boron doping effects in low-temperature epitaxial silicon" Meyerson et al., Appl. Phys. Lett. 50 (2), p. 113 (1987).

Meyerson et al. "Nonequilibrium boron doping effects in low-temperature epitaxial silicon", Appl. Phys. Lett. 50 (2), p. 113 (1987).

Li, "Surface and Bulk Passsivation of Multicrystalline Silicon Solar Cells by Silicon Nitride (H) Layer: Modeling and Experiments", Ph.D. dissertation, N.J. Inst. of Tech., Jan. 2009.

Kanani, Nasser. Electroplating: Basic Principles, Processes and Practice, Chapter 8—"Coating Thickness and its Measurement," 2004, pp. 247-291.

P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.

L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.

\* cited by examiner

HOLE COLLECTORS FOR SILICON PHOTOVOLTAIC CELLS

RELATED APPLICATION

This application claims the benefit of U.S. Provisional Application No. 61/711,838, entitled "Novel Hole-Collecting Emitter for Crystalline Silicon Solar Cells with High-Work-Function TCO and Tunneling Oxide," by inventors Zhigang Xie, Jiunn Benjamin Heng, Wei Wang, Jianming Fu, and Zheng Xu, filed 10 Oct. 2012.

BACKGROUND

Field

This disclosure is generally related to solar cells. More specifically, this disclosure is related to a novel hole collector in a crystalline-Si (c-Si) based solar cell. The hole collector is formed by depositing a layer of high work function TCO and a layer of tunneling oxide on top of the c-Si base layer.

Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are many solar cell structures and a typical solar cell contains a p-n junction that includes a p-type doped layer and an n-type doped layer. In addition, there are other types of solar cells that are not based on p-n junctions. For example, a solar cell can be based on a metal-insulator-semiconductor (MIS) structure that includes an ultra-thin dielectric or insulating interfacial tunneling layer situated between a metal or a highly conductive layer and a doped semiconductor layer.

In a p-n junction based solar cell, the absorbed light generates carriers. These carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

To increase the conversion efficiency, a solar cell structure should allow the photon-generated carriers to effectively transport to the electrode. To do so, high quality carrier collectors for both types of carriers (electrons and holes) are needed. A typical p-n junction based solar cell includes a lightly n- or p-type doped base and a heavily doped emitter with an opposite doping type. For solar cells with an n-type doped emitter, electrons are collected by the n-type emitter, and the holes flow to the opposite side. The n-type doped emitter is also called an electron collector. To prevent minority carrier recombination at the surface the opposite side, a back surface field (BSF) layer (which is often a heavily doped layer having the same doping type as the base) can be formed at the surface of the opposite side. If the BSF layer is p-type doped, it collects holes. Similarly, for solar cells with a p-type doped emitter, holes are collected by the p-type emitter, and electrons flow to the opposite side to be collected by the n-type BSF layer.

Surface passivation is important for solar cell performance because it directly impacts the open circuit voltage ($V_{oc}$). Note that a good $V_{oc}$ implies a good temperature coefficient, which enables a better solar cell performance at higher temperatures. One attempt to passivate the surface of the solar cell is to cover the surface of the Si absorber with materials having a wider bandgap, such as amorphous-Si (a-Si), or a thin layer of insulating material (such as silicon oxide or nitride). However, such passivation layers often impede current flows unintentionally. Such a current-impeding effect often has a greater impact on the holes than the electrons due to the fact that the valence band offset at the interface is larger than the conduction band offset. In addition, in Si, holes have much lower mobility than electrons. It is very difficult to get a high activation rate of p-type dopants. Hence, collecting hole current is often the bottleneck for further improving the fill factor.

SUMMARY

One embodiment of the present invention provides a solar cell. The solar cell includes a base layer comprising crystalline Si (c-Si), a hole collector situated on a first side of the base layer, and an electron collector situated on a second side of the base layer, which is opposite the first side. The hole collector includes a quantum-tunneling-barrier (QTB) layer situated adjacent to the base layer and a transparent conducting oxide (TCO) layer situated adjacent to the QTB layer. The TCO layer has a work function of at least 5.0 eV.

In a variation on the embodiment, the base layer includes at least one of: a mono-crystalline silicon wafer, and an epitaxially grown crystalline-Si (c-Si) thin film.

In a variation on the embodiment, the QTB layer includes at least one of: silicon oxide ($SiO_x$), hydrogenated $SiO_x$, silicon nitride ($SiN_x$), hydrogenated $SiN_x$, aluminum oxide ($AlO_x$), aluminum nitride ($AlN_x$), silicon oxynitride (SiON), hydrogenated SiON, amorphous Si (a-Si), hydrogenated a-Si, carbon doped Si, and SiC.

In a variation on the embodiment, the QTB layer has a thickness between 1 and 50 angstroms.

In a variation on the embodiment, the QTB layer includes one of: $SiO_x$ and hydrogenated $SiO_x$, and the QTB layer is formed using at least one of the following techniques: running hot deionized water over the base layer, ozone oxygen oxidation, atomic oxygen oxidation, thermal oxidation, wet or steam oxidation, atomic layer deposition, low-pressure radical oxidation, and plasma-enhanced chemical-vapor deposition (PECVD).

In a variation on the embodiment, the TCO layer includes one or more of: tungsten doped indium oxide (IWO), Sn doped indium oxide (ITO), GaInO (GIO), GaInSnO (GITO), ZnInO (ZIO), ZnInSnO (ZITO).

In a variation on the embodiment, the TCO layer is formed using a low damage deposition technique comprising one of: radio frequency (RF) sputtering, thermal evaporation, molecular beam epitaxy (MBE), metalorganic chemical vapor deposition (MOCVD), atomic layer deposition (ALD), and ion plating deposition (IPD).

In a variation on the embodiment, hole collector is situated on a front surface of the solar cell, facing incident light. If the base layer is lightly doped with n-type dopants, then the hole collector acts as a front-side emitter. If the base layer is lightly doped with p-type dopants, then the hole collector acts as a front surface field (FSF) layer.

In a further variation, the electron collector is situated on a back surface of the solar cell, facing away from the incident light. If the base layer is lightly doped with n-type dopants, then the electron collector acts as a back surface field (BSF) layer. If the base layer is lightly doped with p-type dopants, then the electron collector acts as a backside emitter.

In a further variation, the electron collector comprises one or more of: a QTB layer, amorphous-Si (a-Si), hydrogenated a-Si, and micro-crystalline Si.

In a further variation, the electron collector is graded doped and has a doping concentration ranging between $1\times10^{12}/cm^3$ and $5\times10^{20}/cm^3$.

In a variation on the embodiment, the hole collector is situated on a back surface of the solar cell, facing way from incident light. If the base layer is lightly doped with n-type dopants, then the hole collector acts as a back-side emitter. If the base layer is lightly doped with p-type dopants, then the hole collector acts as a back surface field (BSF) layer.

In a further variation, the electron collector is situated on a front surface of the solar cell, facing the incident light. If the base layer is lightly doped with n-type dopants, then the electron collector acts as a front surface field (FSF) layer. If the base layer is lightly doped with p-type dopants, then the electron collector acts as a front-side emitter.

In a variation on the embodiment, the base layer has an n-type or a p-type doping concentration ranging between $1\times10^{15}/cm^3$ and $1\times10^{16}/cm^3$.

BRIEF DESCRIPTION OF THE FIGURES

In the figures, like reference numerals refer to the same figure elements.

DETAILED DESCRIPTION

Figure 1A:
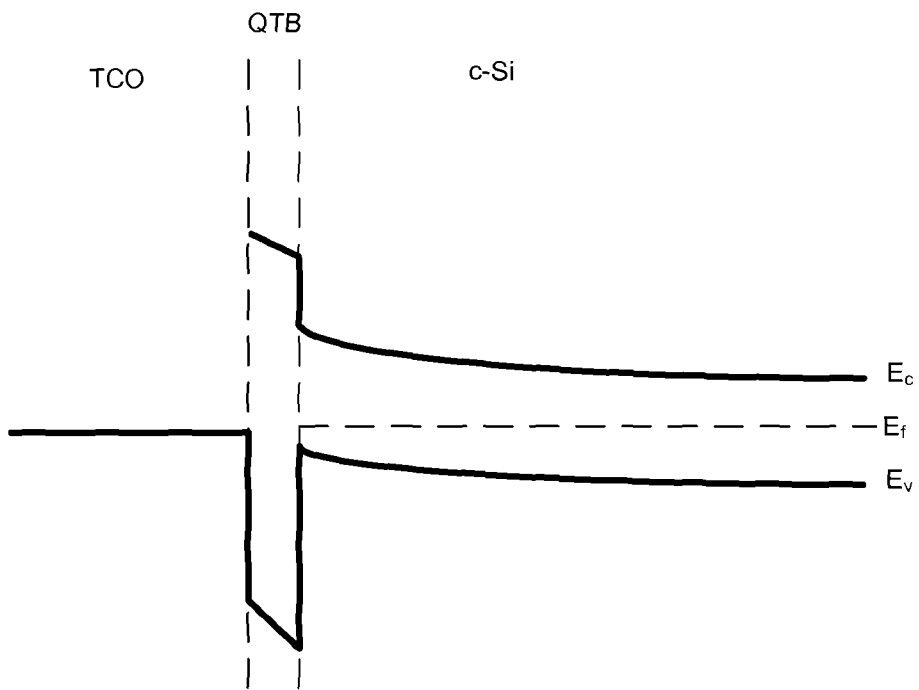
FIG. 1A presents a diagram illustrating the band diagrams at the interface between crystalline-Si and a TCO material that has a work function close to the Si valence band edge.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a crystalline-Si (c-Si) based solar cell that includes a novel, transparent hole collector. The novel hole collector includes a layer of transparent conducting oxide (TCO) material that has a work function of at least 5.0 eV and a quantum tunneling barrier (QTB) layer. The novel, transparent hole collector can be situated at either the front or the back side of the solar cell with the QTB layer in direct contact with the c-Si base layer, and can act as either an emitter or a back surface field (BSF) layer.

TCO/QTB Structure-Based Hole Collector

The valence band edge for c-Si is roughly 5.17 eV. Hence, for a heterojunction solar cell, an ideal p-type emitter should have a valence band of at least 5.5 eV in order to ensure excellent surface passivation and low light absorption (for emitters placed on the side facing incoming light). Amorphous-Si (a-Si) is often used to form the p-type emitter due to its wider bandgap. Such solar cells also need to have a metal contact layer or a TCO layer deposited on top of the emitter for current collection. The work function of the metal or TCO layer needs to be higher than the emitter valence band edge in order to ensure good ohmic contact and work function matching. However, there are few choices of material that can meet such high work function requirements.

Another factor that limits the performance of the conventional heterojunction solar cells is the loss of light due to emitter absorption. Note that the light absorbed by the emitter layer cannot contribute to the photocurrent, thus reducing the efficiency of the solar cell. A typical heterojunction solar cell may lose up to 5% of light due to the emitter absorption.

To improve the performance of the heterojunction solar cells, hydrogenated a-Si and thermal oxide have been used to passivate the Si absorber interface. Heterojunction solar cells that include thermal oxide as a QTB can have an open circuit voltage as high as 740 mV. However, such a tunneling mechanism limits the short circuit current. More specifically, the intra-band tunneling between two non-degenerated semiconductor materials is not strong enough to sustain the high flow of photocurrent.

To overcome the aforementioned shortcomings of the p-type emitters of conventional Si-based heterojunction solar cells, embodiments of the present invention provide solar cells that include a hole collector that is transparent to light. The transparent hole collector interfaces directly with the c-Si base, and can function as either an emitter or a BSF layer, depending on the doping type of the base layer. In some embodiments, the transparent hole collector includes a TCO layer and a thin quantum tunneling barrier (QTB) layer.

In embodiments of the present invention, instead of having an emitter made of a wider bandgap material (such as a-Si), the TCO/QTB structure can serve as a p-type emitter by directly interfacing with the c-Si base layer. More specifically, the TCO layer, which is heavily doped, can act as a metal layer, and the QTB layer can function as a passivation layer and tunneling barrier. Because the TCO/QTB emitter directly interfaces with c-Si, the work function of the TCO only needs to match the valence band edge of the c-Si, which is roughly 5.17 eV. Hence, it is possible to select from a wide array of TCO materials that meet the work function requirement. More specifically, as long as the work function of the TCO material is sufficiently close to (within 0.1 eV) or higher than the c-Si valence band edge, a strong tunneling through the thin QTB layer can occur.

TCO material has been widely used to coat the front side of heterojunction solar cells in order to facilitate the spread of the photo-generated current and to provide anti-reflection coating (ARC). Typical TCO materials have a wider bandgap, thus being transparent to visible light. The heavily doped TCO material may incur absorption loss at the near IR regime. In general, a good TCO film may introduce 2-2.5% optical loss, all in the near IR regime. Compared with the light loss caused by conventional p-type emitters, optical loss induced by the TCO layer is much less.

Note that most TCO materials are heavily doped to an extent (with a doping concentration of at least $1\times10^{19}/cm^3$, sometimes higher than $2\times10^{20}/cm^3$) that they have degenerated carrier distribution. Moreover, the improved low-damage deposition techniques have made it possible to deposit a TCO film with an interface defect density ($D_{it}$) less than $1e^{11}/cm^2$. The degenerated carrier distribution in the TCO film and the low $D_{it}$ make it possible to have a strong tunneling effect when the TCO/QTB structure is in contact with a lightly doped c-Si base. The tunneling process depends on the available carrier concentration at the starting side (the c-Si side) and the density of states at the receiving side (the TCO side), according to the Wentzel-Kramers-Brillouin (WKB) approximation. Strong tunneling can present in two different situations depending on the different work functions of the TCO materials.

FIG. 1A presents a diagram illustrating the band diagrams at the interface between crystalline-Si and a TCO material that has a work function close to the Si valence band edge. In FIG. 1A, the work function of the TCO material is close to (the difference is within 0.1 eV) the c-Si valence band edge. Due to the tunneling effect, holes can be transferred from the c-Si side to the TCO side. Depending on the doping type of the lightly doped c-Si, there might be hole accumulation (if the c-Si is p-type doped) or carrier inversion (if the c-Si is n-type doped) at the interface, and the highest hole concentration can be close to the TCO doping (around $1\times10^{20}/cm^3$). Note that, as shown in FIG. 1A, there is band bending at the QTB/Si interface, pushing the Fermi level closer to the valence band edge ($E_v$) of the Si. Because the band offset between the Si and the TCO is very small, and considering the thermal broadening, the tunneling effect can be quite strong.

Figure 1B:
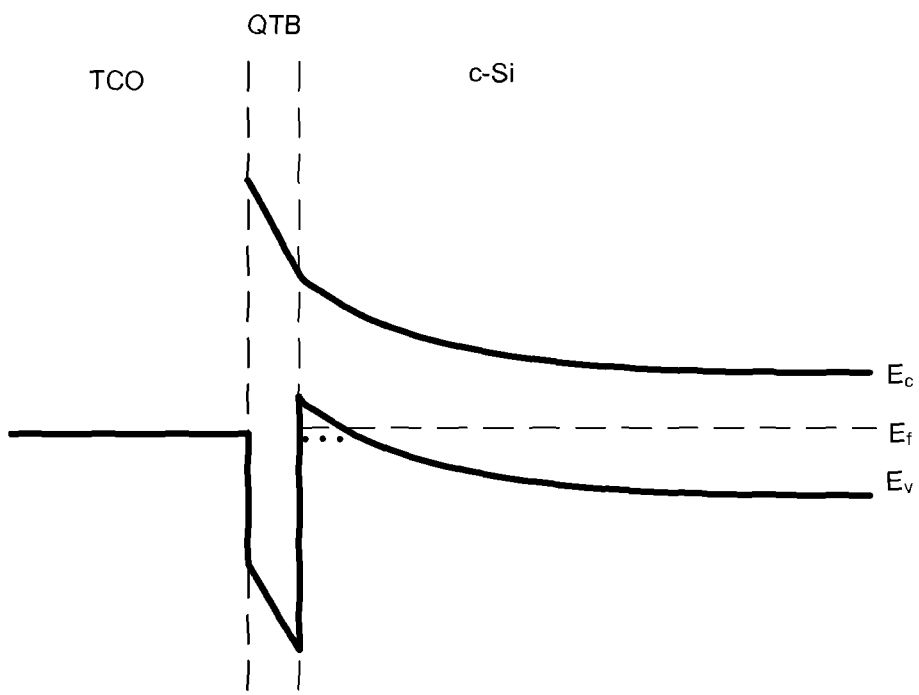
FIG. 1B presents a diagram illustrating the band diagrams at the interface between crystalline-Si and a TCO material that has a work function considerably larger than the Si valence band edge.

FIG. 1B presents a diagram illustrating the band diagrams at the interface between crystalline-Si and a TCO material that has a work function considerably larger than the Si valence band edge. In FIG. 1B, the work function of the TCO material is considerable larger than the Si valence band edge, which is 5.17 eV. At the QTB/Si interface, the slope for the band bending is so big that quantum wells for holes are forming. The lowest energy level for the heavily degenerated holes on the Si side, hence, is not at the valence band edge, but is the first confinement energy level, which can be 0.1 eV above the valence band edge (as shown by the dots in FIG. 1B). In addition, heavy holes and light holes have different masses and energy states. As a result, it is relatively easy to achieve energy level alignment, which is required due to the energy conservation requirement) for the intra-band tunneling of the holes. Electrons, on the other hand, will be repelled by the barrier. There will be no tunneling of the electrons because the receiving side is within the forbidden band.

Note that, if the work function of the TCO material is much less than the Si valence band edge, such as being less than 5.0 eV, there will not be sufficient band bending, and thus not enough tunneling through the QTB layer.

Figure 2:
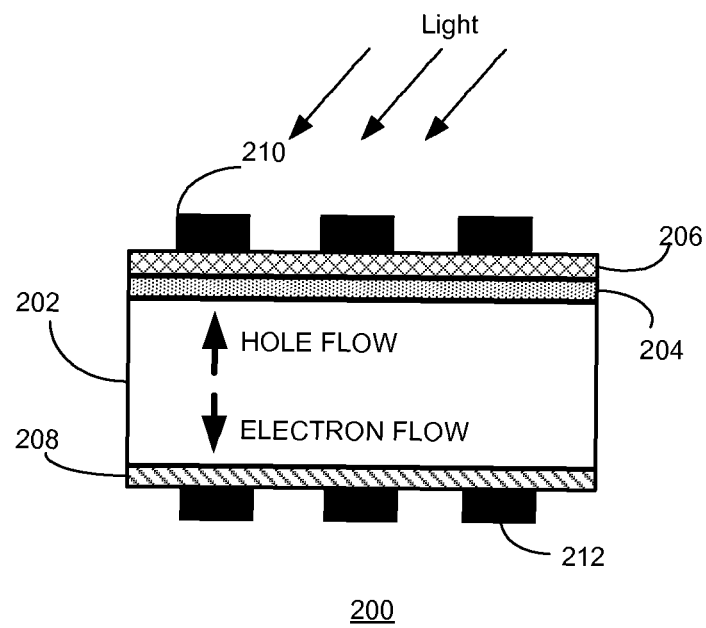
FIG. 2 presents a diagram illustrating an exemplary solar cell with the TCO/QTB hole collector, in accordance with an embodiment of the present invention.

FIG. 2 presents a diagram illustrating an exemplary solar cell with the TCO/QTB hole collector, in accordance with an embodiment of the present invention. Solar cell 200 includes a substrate 202, a QTB layer 204, a TCO layer 206, a back surface field (BSF) layer 208, a front-side electrode 210, and a back-side electrode 212.

Substrate 202 includes a layer of c-Si that is epitaxially grown or a c-Si wafer cut from an ingot obtained via the Czochralski (CZ) or floating zone (FZ) process, and is lightly doped with either n-type dopants or p-type dopants. In one embodiment, substrate 202 is n-type doped. The thickness of substrate 202 can be between 80 and 300 µm. In some embodiments, the thickness of substrate 202 is between 120 and 180 µm. The doping concentration of substrate 202 can be between $1\times10^{15}/cm^3$ and $1\times10^{16}/Cm^3$. In one embodiment, the doping concentration of substrate 202 is less than $5\times10^{15}/cm^3$. In a further embodiment, substrate 202 is graded doped with the doping concentration at the Si/QTB interface being less than $1\times10^{16}/cm^3$.

QTB layer 204 directly contacts substrate 202, and can include one or more of: a dielectric thin film and a layer of wide bandgap semiconductor material with low or intrinsic doping. Exemplary materials used for the dielectric thin film include, but are not limited to: silicon oxide ($SiO_x$), hydrogenated $SiO_x$, silicon nitride ($SiN_x$), hydrogenated $SiN_x$, silicon oxynitride (SiON), hydrogenated SiON, aluminum oxide ($AlO_x$), and aluminum nitride ($AlN_x$). Examples of the wide bandgap materials include, but are not limited to: amorphous Si (a-Si), hydrogenated a-Si, carbon doped a-Si, and silicon carbide (SiC). In one embodiment, QTB layer 204 includes $SiO_x$, which can be partially oxidized Si, such as SiO. The $SiO_x$ layer can be formed using various oxidation techniques, such as running hot deionized water over the substrate, ozone oxygen oxidation, atomic oxygen oxidation, thermal oxidation, steam or wet oxidation, atomic layer deposition, and plasma-enhanced chemical vapor deposition (PECVD). The thickness of QTB layer 204 can be between 5 and 50 angstroms. In one embodiment, QTB layer 204 includes a $SiO_x$ layer having a thickness between 8 and 15 Å.

TCO layer 206 includes a layer of high work function TCO material. In one embodiment, the high work function TCO material has a work function of at least 5.0 eV. Examples of high work function TCO materials include, but are not limited to: tungsten doped indium oxide (IWO), Sn doped indium oxide (ITO), GaInO (GIO), GaInSnO (GITO), ZnInO (ZIO), ZnInSnO (ZITO), and their combinations. Note that the work function of most TCO materials can be tuned by adjusting the carrier concentration and doping. For example, ITO with 3% or 5% Sn has a work function between 5.0 and 5.3 eV. In addition, one can control the TCO work function by controlling the crystalline orientation and surface condition. To ensure sufficiently low $D_{it}$, in one embodiment, TCO layer 206 is deposited on QTB layer 204 using a low-damage deposition method. Examples of low-damage deposition methods include, but are not limited to: radio frequency (RF) sputtering; thermal evaporation; epitaxial growth, such as molecular beam epitaxy (MBE) and metalorganic chemical vapor deposition (MOCVD); atomic layer deposition (ALD); and ion plating deposition (IPD). In one embodiment, the $D_{it}$ at the TCO/QTB interface is less than $1\times10^{11}/cm^2$, which ensures good surface passivation. TCO layer 206 is often heavily doped (with metal ions) with a doping concentration of at least $1\times10^{19}/cm^3$. In one embodiment, the doping concentration of TCO layer 206 is greater than $2\times10^{20}/cm^3$. The thickness of TCO layer 206 can be controlled to meet the anti-reflection requirement. In one embodiment, TCO layer 206 also acts as an anti-reflection (AR) coating, having a thickness of around 100 nm.

Note that TCO layer 206 and QTB layer 204 together form a p-type emitter, and collect hole current, as shown in FIG. 2 by the upwardly pointing arrow. Compared with the conventional p-type emitters made of wide bandgap materials, such as a-Si, this novel emitter/hole collector reduces emitter absorption because both TCO layer 206 and QTB layer 204 are transparent to visible light.

BSF layer 208 can include a Si layer that is heavily doped with n-type dopant, and is responsible for collecting electron current, as shown in FIG. 2 by the downwardly pointing arrow. In one embodiment, there can be an additional QTB layer situated between BSF layer 208 and substrate 202. Front-side electrode 210 and back-side electrode 212 are responsible for collecting the corresponding current. In one embodiment, front-side electrode 210 and back-side electrode 212 include electroplated or screen-printed metal grid.

In the example shown in FIG. 2, layer 208 is heavily doped with n-type dopants, and substrate 202 can be doped with either n- or p-type dopants. If substrate 202 is lightly doped with n-type dopants, then the TCO/QTB structure will act as a front-side emitter and layer 208 will act as a BSF layer. On the other hand, if substrate 202 is lightly doped with p-type dopants, then the TCO/QTB structure will act as a front surface field (FSF) layer and layer 208 will act as a back-side emitter. In both situations, the TCO/QTB structure collects hole current and the heavily n-doped layer 208 collects electron current.

Note that the TCO/QTB structure collects hole current when placed in direct contact with the lightly doped c-Si substrate. Hence, in addition to functioning as a p-type emitter and being placed at the light-facing side of a solar cell, it is also possible to place this structure at the backside of the solar cell. In one embodiment, the solar cell includes a front n-type emitter that collects electron current and a back TCO/QTB structure acting as a BSF layer to collect hole current. Note that because the TCO/QTB structure is transparent to visible light, this type of solar cell can be bifacial, meaning that light shining on both sides of the solar cell can be absorbed to generate photo current.

Figure 3:
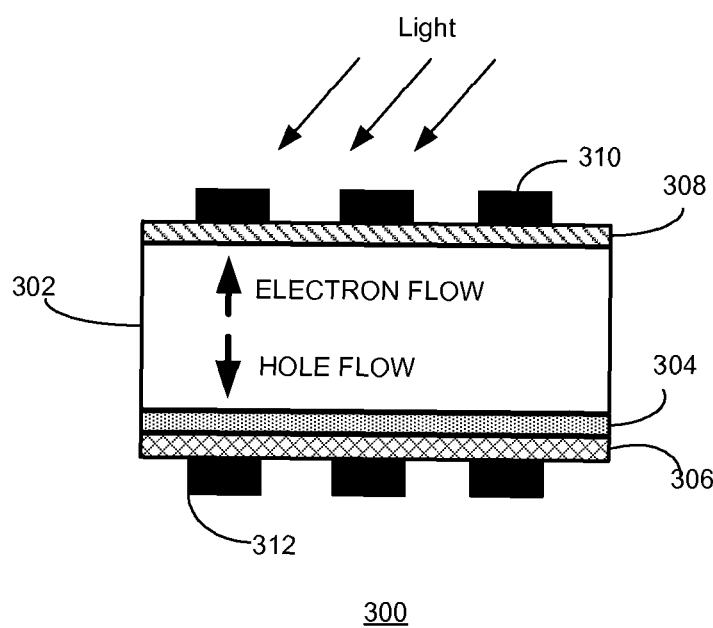
FIG. 3 presents a diagram illustrating an exemplary solar cell with the TCO/QTB hole collector, in accordance with an embodiment of the present invention.

FIG. 3 presents a diagram illustrating an exemplary solar cell with the TCO/QTB hole collector, in accordance with an embodiment of the present invention. Solar cell 300 includes a substrate 302, a QTB layer 304, a TCO layer 306, a front-side emitter layer 308, a front-side electrode 310, and a back-side electrode 312.

Substrate 302 can be similar to substrate 202 shown in FIG. 2. More specifically, substrate 302 can include lightly doped c-Si, with a doping concentration of less than $1 \times 10^{16}/cm^3$. The thickness of substrate 302 can be between 80 and 300 μm. In some embodiments, the thickness of substrate 302 is between 120 and 180 μm. Like substrate 202, substrate 302 can be either n-type doped or p-type doped. In one embodiment, substrate 302 is lightly doped with p-type dopants.

QTB layer 304 is situated directly underneath substrate 302. Materials and processes used to form QTB layer 304 can be similar to those used to form QTB layer 204. In addition, the thickness of QTB layer 304 is similar to that of QTB layer 204, which can be between 1 and 50 angstroms.

Like TCO layer 206, TCO layer 306 includes a layer of high work function TCO material, such as IWO, ITO, GIO, GITO, ZIO, ZITO, and their combinations. The process used to form TCO layer 306 can be similar to the one used to form TCO layer 206. If solar cell 300 is bifacial, TCO layer 306 can also be used as an AR coating.

Because the TCO/QTB structure shown in FIG. 3 is used to collect hole current at the backside of solar cell 300, front-side emitter 308 needs to be able to collect electron current. In one embodiment, front-side emitter 308 is an n-type emitter. Front-side emitter 308 not only collects electron current but can also passivate the surface. Materials used to form front-side emitter 308 can include, but are not limited to: a-Si, multi-crystalline semiconductor material, and a wide bandgap semiconductor material. Front-side emitter 308 can be graded doped, with a doping range from $1 \times 10^{12}/cm^3$ to $5 \times 10^{20}/cm^3$. The region that is close to the interface between front-side emitter 308 and substrate 302 has a lower doping concentration. In some embodiments, front-side emitter 308 may include one of: a metal-insulator-semiconductor (MIS) structure, or a TCO-insulator-semiconductor structure. Note that, in order to collect electrons, the TCO used here needs to have a low (less than 4.2 eV) work function. In one embodiment, it is also possible to have an additional QTB layer situated between front-side emitter 308 and substrate 302.

Front-side electrode 310 and back-side electrode 312 are responsible for collecting the corresponding current. In one embodiment, front-side electrode 310 and back-side electrode 312 include electroplated or screen-printed metal grid.

In the example shown in FIG. 3, layer 308 is heavily doped with n-type dopants, and substrate 302 can be doped with either n- or p-type dopants. If substrate 302 is lightly doped with p-type dopants, then the TCO/QTB structure will act as a BSF layer and layer 308 will act as a front-side emitter. On the other hand, if substrate 302 is lightly doped with n-type dopants, then the TCO/QTB structure will act as a back-side emitter and layer 308 will act as a FSF layer. In both situations, the TCO/QTB structure collects hole current and the heavily n-doped layer 308 collects electron current.

Note that, although in FIGS. 2 and 3, the light is coming from the top side of the solar cells (as shown by the arrows), in practice, because the TCO/QTB structure is transparent, it is possible to have light coming from both sides of the solar cells.

Fabrication Method

Figure 4:
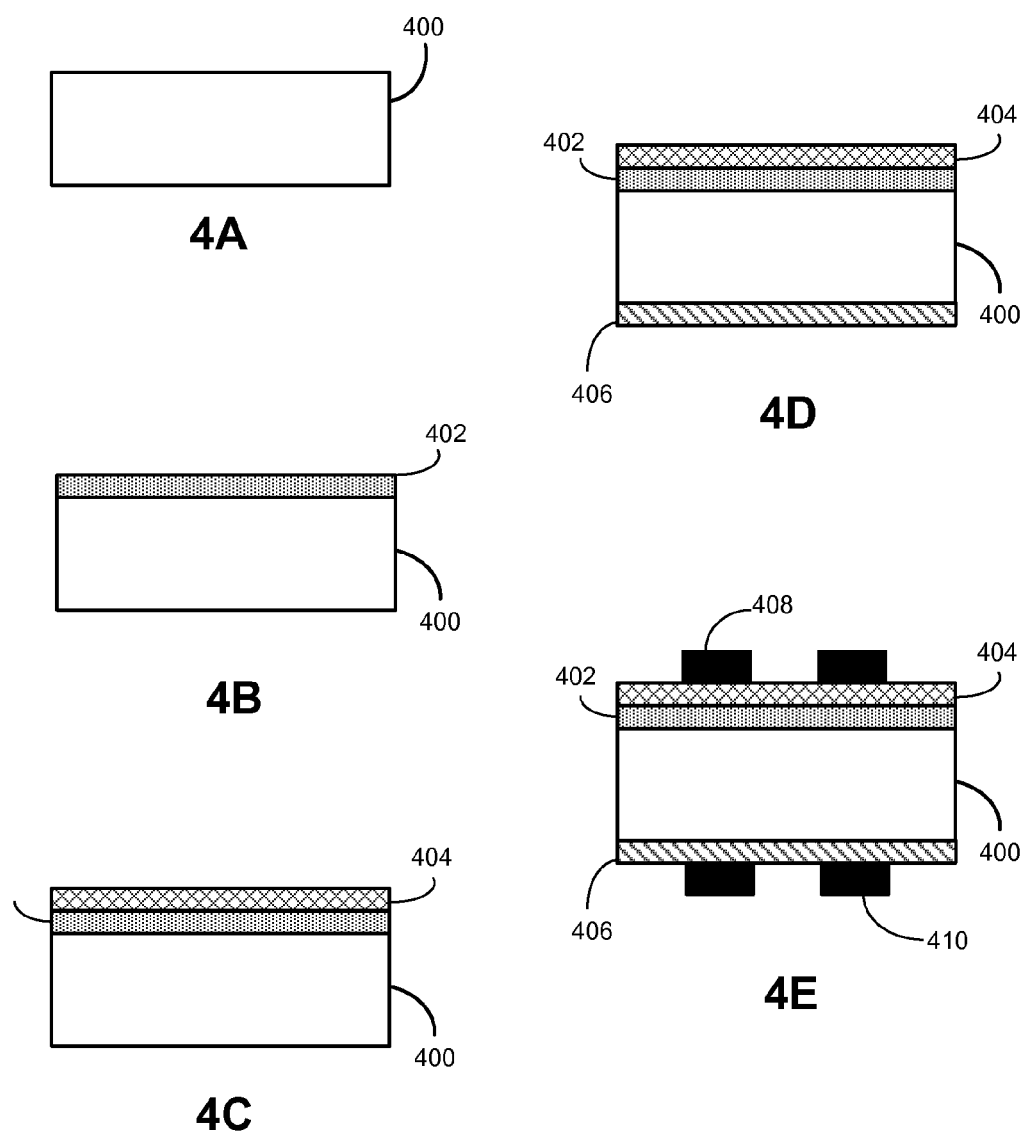
FIG. 4 presents a diagram illustrating the process of fabricating a solar cell with a novel hole-collecting emitter, in accordance with an embodiment of the present invention.

Either n- or p-type doped high-quality solar-grade silicon (SG-Si) wafers can be used to build the solar cell with the novel hole collector. In one embodiment, an n-type doped SG-Si wafer is selected to fabricate a solar cell with the TCO/QTB structure acting as a hole-collecting emitter. FIG. 4 presents a diagram illustrating the process of fabricating a solar cell with a novel hole-collecting emitter, in accordance with an embodiment of the present invention.

In operation 4A, an SG-Si substrate 400 is prepared. The resistivity of the SG-Si substrate is typically in, but not limited to, the range between 0.5 Ohm-cm and 10 Ohm-cm. SG-Si substrate can include a Si wafer that is cut from an ingot obtained via the CZ/FZ process. The preparation operation includes typical saw damage etching that removes approximately 10 μm of silicon. In one embodiment, surface texturing can also be performed. Afterwards, the SG-Si substrate goes through extensive surface cleaning. In addition, SG-Si substrate can also come from a epitaxial process (such as MBE or MOCVD) where a c-Si epitaxial film is grown on and then removed from a growth substrate.

In operation 4B, a thin layer of high-quality (with $D_{it}$ less than $1 \times 10^{11}/cm^2$) dielectric or wide bandgap semiconductor material is deposited on the front surface of SG-Si substrate 400 to form front-side passivation/tunneling layer 402. In one embodiment, both the front and back surfaces of SG-Si substrate 400 are deposited with a thin layer of dielectric or wide bandgap semiconductor material. Various types of dielectric materials can be used to form the passivation/tunneling layers, including, but not limited to: silicon oxide ($SiO_x$), hydrogenated $SiO_x$, silicon nitride ($SiN_x$), hydrogenated $SiN_x$, silicon oxynitride (SiON), hydrogenated SiON, aluminum oxide ($AlO_x$), and aluminum nitride ($AlN_x$). If front-side passivation/tunneling layer 402 includes $SiO_x$ or hydrogenated $SiO_x$, various deposition techniques can be used to deposit such oxide layers, including, but not limited to: thermal oxidation, atomic layer deposition, wet or steam oxidation, low-pressure radical oxidation, plasma-enhanced chemical-vapor deposition (PECVD), etc. The thickness of the tunneling/passivation layer can be between 5 and 50 angstroms, preferably between 8 and 15 angstroms. Note that the well-controlled thickness of the tunneling/passivation layer ensures good tunneling and passivation effects. In addition to dielectric material, a variety of wide bandgap semiconductor materials, such as a-Si, hydrogenated a-Si, carbon doped a-Si, SiC, can also be used to form the tunneling/passivation layer.

In operation 4C, a layer of high work function TCO material is deposited on top of front-side passivation/tunneling layer 402 using a low damage deposition technique to form a TCO layer 404. In one embodiment, the work function of TCO layer 404 is at least 5.0 eV. Examples of high work function TCO materials include, but are not limited to: IWO, ITO, GIO, GITO, ZIO, ZITO, and their combinations. Examples of the low-damage deposition technique include, but are not limited to: radio frequency (RF) sputtering; thermal evaporation; epitaxial growth, such as molecular beam epitaxy (MBE) and metalorganic chemical vapor deposition (MOCVD); atomic layer deposition (ALD); and ion plating deposition (IPD). In one embodiment, the $D_{it}$ at the TCO/QTB interface is controlled to be less than $1\times10^{11}/cm^2$, which ensures good surface passivation. The thickness of TCO layer 404 can be determined based on the anti-reflection requirement.

The combination of high work function TCO layer 404 and passivation/tunneling layer 402 functions as a hole-collecting emitter when directly interfaced with SG-Si substrate 400. Such a structure eliminates the need for an additional emitter that can collect holes and is made of wide bandgap materials, which may absorb a small portion of incoming light. On the contrary, this new hole-collecting emitter is transparent to visible light, thus significantly increasing the solar cell efficiency. In addition, the elimination of the wide bandgap emitter simplifies the fabrication process, as the deposition of a TCO layer has been part of the standard fabrication process of conventional solar cells.

In operation 4D, a layer of a-Si with graded doping is deposited on the back surface of SG-Si substrate 400 to form back surface field (BSF) layer 406. In one embodiment, BSF layer 406 is n-type doped using phosphorous as dopant. The thickness of BSF layer 406 can be between 3 and 30 nm. BSF layer 406 collects the electron current and improves the back-side passivation. For graded doped BSF layer 406, the region within BSF layer 406 that is adjacent to SG-Si substrate 400 has a lower doping concentration, and the region that is away from SG-Si substrate 400 has a higher doping concentration. The lower doping concentration ensures minimum defect density at the interface between SG-Si substrate 400 and BSF layer 406, and the higher concentration on the other side ensures good ohmic-contact to subsequently formed back-side electrode. In one embodiment, the doping concentration of BSF layer 406 varies from $1\times10^{12}/cm^3$ to $5\times10^{20}/cm^3$. In addition to a-Si, it is also possible to use other materials, such as hydrogenated a-Si, micro-crystalline Si, or a semiconductor material with a wide bandgap, to form BSF layer 406. Using micro-crystalline Si material for BSF layer 406 can ensure lower series resistance and better ohmic contact. In some embodiments, BSF layer 406 may include one of: a metal-insulator-semiconductor (MIS) structure, or a TCO-insulator-semiconductor structure. Note that in order to collect electrons the TCO used here needs to have a low (less than 4.2 eV) work function.

In operation 4E, front-side electrode 408 and back-side electrode 410 are formed on the surfaces of TCO layer 404 and BSF layer 406, respectively. In some embodiments, front-side electrode 408 and/or back-side electrode 410 include Ag finger grids, which can be formed using various techniques, including, but not limited to: screen printing of Ag paste, inkjet or aerosol printing of Ag ink, and evaporation. In some embodiments, front-side electrode 408 and back-side electrode 410 can include a Cu grid formed using various techniques, including, but not limited to: electroless plating, electroplating, sputtering, and evaporation.

Figure 5:
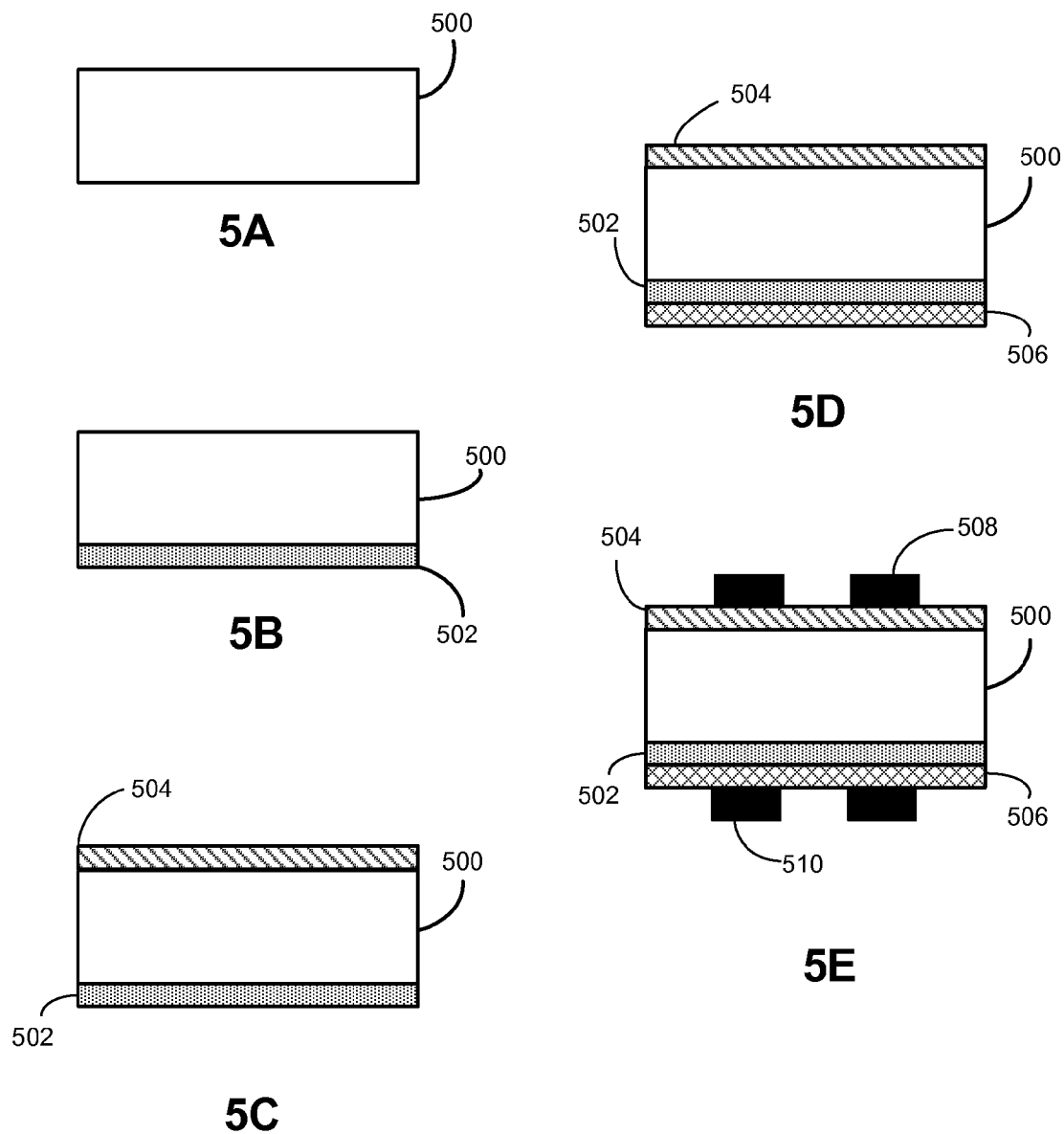
FIG. 5 presents a diagram illustrating the process of fabricating a solar cell with a novel hole-collecting BSF layer, in accordance with an embodiment of the present invention.

In some embodiments, the TCO/QTB structure can be placed at the backside of the solar cell to act as a hole-collecting BSF layer. FIG. 5 presents a diagram illustrating the process of fabricating a solar cell with a novel hole-collecting BSF layer, in accordance with an embodiment of the present invention.

In operation 5A, an SG-Si substrate 500 is prepared using a process that is similar to operation 4A.

In operation 5B, a thin layer of high-quality (with $D_{it}$ less than $1\times10^{11}/cm^2$) dielectric or wide bandgap semiconductor material is deposited on the back surface of SG-Si substrate 500 to form back-side passivation/tunneling layer 502. The processes and materials that can be used to form back-side passivation/tunneling layer 502 are similar to the ones used in operation 4B. In one embodiment, both the front and back surfaces of SG-Si substrate 500 are deposited with a thin layer of dielectric or wide bandgap semiconductor material.

In operation 5C, a layer of a-Si with graded doping is deposited on the front surface of SG-Si substrate 500 to form an emitter layer 504, which faces the incident sunlight. In one embodiment, emitter layer 504 collects electron current and is doped with n-type dopants, such as phosphorus. The thickness of emitter layer 504 is between 2 and 50 nm. Note that the doping profile of emitter layer 504 can be optimized to ensure good ohmic contact, minimum light absorption, and a large built-in electrical field. In one embodiment, the doping concentration of emitter layer 504 varies from $1\times10^{12}/cm^3$ to $5\times10^{20}/cm^3$. In a further embodiment, the region within emitter layer 504 that is adjacent to SG-Si substrate 500 has a lower doping concentration, and the region that is away from SG-Si substrate 500 has a higher doping concentration. The lower doping concentration ensures minimum defect density at the interface, and the higher concentration on the other side prevents emitter layer depletion. In addition to a-Si, materials used to form emitter layer 504 can also include hydrogenated a-Si, micro-crystalline Si, or a semiconductor material with a wide bandgap. Moreover, emitter layer 504 can include other types of structures, such as MIS or a TCO-insulator-semiconductor structure. Note that, in order to collect electrons, the TCO used here needs to have a low (less than 4.2 eV) work function.

In operation 5D, a layer of high work function TCO material is deposited on the surface of passivation/tunneling layer 502 to form a back-side TCO layer 506. Materials and processes that can be used to form back-side TCO layer 506 are similar to the ones used in operation 4C.

The combination of high work function TCO layer 506 and passivation/tunneling layer 502 functions as a hole-collecting BSF layer when directly interfaced with SG-Si substrate 500. In addition to collecting hole current, the TCO/QTB structure also passivates the backside of the solar cell.

In operation 5E, front-side electrode 508 and back-side electrode 510 are formed on the surfaces of emitter layer 504 and TCO layer 506, respectively. Materials and processes that can be used to form front-side electrode 508 and back-side electrode 510 are similar to the ones used in operation 4E.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar cell, comprising:
    a base layer comprising crystalline Si (c-Si), wherein the base layer is lightly doped in entirety with a doping concentration between $1 \times 10^{15}/cm^3$ and $1 \times 10^{16}/cm^3$;
    a hole collector positioned on a first surface of the base layer, wherein the hole collector includes a quantum-tunneling-barrier (QTB) layer and a transparent conductive oxide (TCO) layer, wherein the QTB layer is in direct physical contact with and substantially covers in entirety the first surface of the base layer, wherein the TCO layer is in direct physical contact with and substantially covers in entirety a surface the QTB layer, wherein a doping concentration at an interface between the base layer and the QTB layer is less than $1 \times 10^{16}/cm^3$, and wherein the TCO layer has a work function of at least 5.0 eV; and
    an electron collector positioned on a second surface of the base layer, wherein the second surface is opposite to the first surface.

2. The solar cell of claim 1, wherein the base layer comprises at least one of:
    a mono-crystalline silicon wafer; and
    an epitaxially grown crystalline-Si (c-Si) thin film.

3. The solar cell of claim 1, wherein the QTB layer comprises at least one of:
    silicon oxide ($SiO_x$);
    hydrogenated $SiO_x$;
    silicon nitride ($SiN_x$);
    hydrogenated $SiN_x$;
    aluminum oxide ($AlO_x$);
    aluminum nitride ($AlN_x$);
    silicon oxynitride (SiON);
    hydrogenated SiON;
    amorphous Si (a-Si);
    hydrogenated a-Si;
    carbon doped Si; and
    SiC.

4. The solar cell of claim 1, wherein the QTB layer has a thickness between 1 and 50 angstroms.

5. The solar cell of claim 1, wherein the QTB layer comprises one of: $SiO_x$ and hydrogenated $SiO_x$, and wherein the QTB layer is formed using at least one of the following techniques:
    running hot deionized water over the base layer;
    ozone oxygen oxidation;
    atomic oxygen oxidation;
    thermal oxidation;
    wet or steam oxidation;
    atomic layer deposition;
    low-pressure radical oxidation; and
    plasma-enhanced chemical-vapor deposition (PECVD).

6. The solar cell of claim 1, wherein the TCO layer includes one or more of: tungsten doped indium oxide (IWO), Sn doped indium oxide (ITO), GaInO (GIO), GaInSnO (GITO), ZnInO (ZIO), and ZnInSnO (ZITO).

7. The solar cell of claim 1, wherein the TCO layer is formed using a low damage deposition technique comprising one of:
    radio frequency (RF) sputtering;
    thermal evaporation;
    molecular beam epitaxy (MBE);
    metalorganic chemical vapor deposition (MOCVD);
    atomic layer deposition (ALD); and
    ion plating deposition (IPD).

8. The solar cell of claim 1, wherein the hole collector is positioned on a front side of the solar cell, facing incident light, and wherein:
    if the base layer is lightly doped with n-type dopants, the hole collector acts as a front-side emitter; and
    if the base layer is lightly doped with p-type dopants, the hole collector acts as a front surface field (FSF) layer.

9. The solar cell of claim 8, wherein the electron collector is positioned on a back side of the solar cell, facing away from the incident light, and wherein:
    if the base layer is lightly doped with n-type dopants, the electron collector acts as a back surface field (BSF) layer; and
    if the base layer is lightly doped with p-type dopants, the electron collector acts as a back-side emitter.

10. The solar cell of claim 8, wherein the electron collector comprises one or more of:
    a QTB layer;
    amorphous-Si (a-Si);
    hydrogenated a-Si; and
    micro-crystalline Si.

11. The solar cell of claim 8, wherein the electron collector is graded doped and has a doping concentration ranging between $1 \times 10^{12}/cm^3$ and $5 \times 10^{20}/cm^3$.

12. The solar cell of claim 1, wherein the hole collector is positioned on a back side of the solar cell, facing way from incident light, and wherein:
    if the base layer is lightly doped with n-type dopants, the hole collector acts as a back-side emitter; and
    if the base layer is lightly doped with p-type dopants, the hole collector acts as a back surface field (BSF) layer.

13. The solar cell of claim 12, wherein the electron collector is positioned on a front side of the solar cell, facing the incident light, and wherein:
    if the base layer is lightly doped with n-type dopants, the electron collector acts as a front surface field (FSF) layer; and
    if the base layer is lightly doped with p-type dopants, the electron collector acts as a front-side emitter.

* * * * *